US011996367B2

(12) United States Patent
Ko et al.

(10) Patent No.: US 11,996,367 B2
(45) Date of Patent: May 28, 2024

(54) SEMICONDUCTOR DEVICE AND SEMICONDUCTOR PACKAGE INCLUDING THE SAME

(71) Applicant: SAMSUNG ELECTRONICS CO., LTD., Suwon-si (KR)

(72) Inventors: Yeongkwon Ko, Hwaseong-si (KR); Jaeeun Lee, Suwon-si (KR); Junyeong Heo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/328,322

(22) Filed: Jun. 2, 2023

(65) Prior Publication Data

US 2023/0326863 A1 Oct. 12, 2023

Related U.S. Application Data

(63) Continuation of application No. 17/589,301, filed on Jan. 31, 2022, now Pat. No. 11,694,963, which is a
(Continued)

(30) Foreign Application Priority Data

Nov. 7, 2019 (KR) ........................ 10-2019-0141313

(51) Int. Cl.
*H01L 23/538* (2006.01)
*H01L 25/065* (2023.01)
(52) U.S. Cl.
CPC ...... *H01L 23/5385* (2013.01); *H01L 23/5386* (2013.01); *H01L 25/0657* (2013.01)
(58) Field of Classification Search
CPC ..... H01L 2224/022–02215; H01L 2224/0391; H01L 2224/03916; H01L 2224/1148;
(Continued)

(56) References Cited

U.S. PATENT DOCUMENTS 6,316,287 B1 11/2001 Zandman et al.
8,592,988 B2 * 11/2013 Lee ........................ H01L 23/481
257/773
(Continued)

FOREIGN PATENT DOCUMENTS

JP 2005-12206 1/2005
JP 2011-216753 10/2011
(Continued)

OTHER PUBLICATIONS

Extended European Search Report dated Mar. 23, 2021 in Corresponding Application No. EP 20205388.0.
(Continued)

*Primary Examiner* — Ictor A Mandala
*Assistant Examiner* — Lawrence C Tynes, Jr.
(74) *Attorney, Agent, or Firm* — F. Chau & Associates, LLC

(57) ABSTRACT

A semiconductor device includes a semiconductor substrate having a first surface and a second surface opposing each other, a plurality of semiconductor elements disposed on the first surface in a device region, an insulating protective layer, and a connection pad. The second surface is divided into a first region overlapping the device region, and a second region surrounding the first region. The insulating protective layer is disposed on the second surface of the semiconductor substrate, and includes an edge pattern positioned in the second region. The edge pattern includes a thinner portion having a thickness smaller than a thickness of a center portion of the insulating protective layer positioned in the first region and/or an open region exposing the second surface of the semiconductor substrate. The connection pad is disposed on the center portion of the insulating protective layer and is electrically connected to the semiconductor elements.

20 Claims, 17 Drawing Sheets

Related U.S. Application Data continuation of application No. 16/922,163, filed on Jul. 7, 2020, now Pat. No. 11,239,171.

(58) Field of Classification Search
CPC ... H01L 2224/1191; H01L 2224/11916; H01L 2224/2748; H01L 2224/2791; H01L 2224/27916; H01L 2224/73204; H01L 2224/08145; H01L 2224/02372; H01L 2224/023–024; H01L 2224/94; H01L 2224/05009; H01L 2224/05025; H01L 2224/05087; H01L 2224/0509; H01L 2224/0557; H01L 2224/08146; H01L 2224/80895–80896; H01L 2224/0812–08268; H01L 2224/08151–08268; H01L 2224/08135–08148; H01L 23/57–576; H01L 23/552–556; H01L 23/562–576; H01L 23/49833; H01L 23/5385; H01L 23/49822; H01L 23/538–5389; H01L 23/498–49894; H01L 23/3114; H01L 23/535; H01L 23/5226; H01L 23/3157; H01L 25/0657; H01L 25/043; H01L 25/074; H01L 25/0756; H01L 25/117; H01L 25/0652; H01L 25/071; H01L 25/112; H01L 2225/06503–06596; H01L 2225/06541–06544; H01L 2225/06548; H01L 27/0248–0296; H01L 33/44; H01L 24/94; H01L 21/563; G09G 2330/04–045
See application file for complete search history.

(56) References Cited

U.S. PATENT DOCUMENTS

| | | | |
|---|---|---|---|
| 8,598,016 B2 | 12/2013 | Yalamanchili et al. | |
| 8,884,433 B2* | 11/2014 | Lin | H01L 24/05 257/758 |
| 9,123,789 B2* | 9/2015 | Lin | H01L 21/283 |
| 9,299,649 B2* | 3/2016 | Chiu | H01L 21/4853 |
| 9,461,018 B1* | 10/2016 | Tsai | H01L 24/83 |
| 9,666,502 B2* | 5/2017 | Chen | H01L 23/3135 |
| 9,735,131 B2* | 8/2017 | Su | H01L 25/0657 |
| 9,754,832 B2 | 9/2017 | Schmitt et al. | |
| 10,141,259 B1* | 11/2018 | Nakano | H01L 23/5226 |
| 11,107,783 B2* | 8/2021 | Jang | H01L 24/11 |
| 11,239,171 B2 | 2/2022 | Ko et al. | |
| 2001/0009298 A1 | 7/2001 | Zandman et al. | |
| 2003/0157748 A1* | 8/2003 | Kim | H01L 21/76831 257/E21.705 |
| 2004/0119166 A1* | 6/2004 | Sunohara | H01L 21/6835 257/758 |
| 2011/0241178 A1 | 10/2011 | Miki | |
| 2012/0193779 A1* | 8/2012 | Lee | H01L 21/563 257/737 |
| 2012/0228780 A1* | 9/2012 | Kim | H01L 23/481 257/E23.145 |
| 2012/0241917 A1* | 9/2012 | Ide | H01L 23/585 257/622 |
| 2013/0264720 A1* | 10/2013 | Chun | H01L 21/76898 257/774 |
| 2015/0130068 A1* | 5/2015 | Lin | G11C 7/18 257/773 |
| 2015/0262989 A1* | 9/2015 | Kawasaki | H01L 24/80 257/737 |
| 2017/0025384 A1* | 1/2017 | Park | H01L 25/0657 |
| 2017/0025601 A1* | 1/2017 | Bhushan | G11C 14/009 |
| 2017/0033032 A1* | 2/2017 | Lee | H01L 23/293 |
| 2018/0012804 A1 | 1/2018 | Tateishi | |
| 2018/0026067 A1* | 1/2018 | Lee | H01L 27/14636 257/777 |
| 2018/0090444 A1* | 3/2018 | Lee | H01L 23/5384 |
| 2018/0138137 A1* | 5/2018 | Jin | H01L 24/13 |
| 2018/0175008 A1* | 6/2018 | Fong | H01L 25/50 |
| 2018/0259822 A1 | 9/2018 | Dixit et al. | |
| 2018/0331059 A1 | 11/2018 | Shao et al. | |
| 2019/0067228 A1 | 2/2019 | Son et al. | |
| 2020/0118908 A1* | 4/2020 | Yu | H01L 23/3677 |
| 2020/0176372 A1* | 6/2020 | Hossain | H01L 23/5385 |
| 2020/0203329 A1* | 6/2020 | Kanamori | H01L 27/11573 |
| 2020/0227397 A1* | 7/2020 | Yada | H01L 27/11565 |
| 2021/0104493 A1* | 4/2021 | Vodrahalli | H01L 25/0657 |
| 2021/0143102 A1 | 5/2021 | Ko et al. | |
| 2022/0157731 A1 | 5/2022 | Ko et al. | |

FOREIGN PATENT DOCUMENTS

| | | |
|---|---|---|
| JP | 5394418 | 10/2013 |
| KR | 10-0948999 | 3/2010 |
| KR | 10-2011-0017728 | 2/2011 |
| KR | 10-2018-0005604 | 1/2018 |

OTHER PUBLICATIONS

Notice of Allowance dated Sep. 23, 2021 in Corresponding U.S. Appl. No. 16/922,163.

Notice of Allowance dated Feb. 17, 2023 in Corresponding U.S. Appl. No. 17/589,301.

* cited by examiner

SEMICONDUCTOR DEVICE AND SEMICONDUCTOR PACKAGE INCLUDING THE SAME

CROSS-REFERENCE TO RELATED APPLICATIONS

This application is a continuation application of U.S. patent application Ser. No. 17/589,301 filed Jan. 31, 2022, which is a continuation application of U.S. patent application Ser. No. 16/922,163 filed Jul. 7, 2020, issued as U.S. Pat. No. 11,239,171 on Feb. 1, 2022, which claims priority under 35 U.S.C. § 119 to Korean Patent Application No. 10-2019-0141313, filed on Nov. 7, 2019 in the Korean Intellectual Property Office, the disclosures of which are incorporated by reference herein in their entirety.

TECHNICAL FIELD

Exemplary embodiments of the present inventive concept relate to a semiconductor device, and a semiconductor package including the same.

DISCUSSION OF THE RELATED ART

In general, a plurality of semiconductor devices may be manufactured by performing a series of semiconductor processes on a wafer and cutting the wafer.

In the process of cutting the wafer, damage such as, for example, chipping, burring, or cracking may occur in the semiconductor device. Such damage may occur more frequently and more easily on a surface opposite to a surface to which the cutting process is applied (e.g., a back side of the semiconductor device), resulting in reduced production yield.

As a solution for high capacity and/or high performance of the semiconductor device, a packaging technology for stacking a plurality of semiconductor chips is widely used. For example, development of semiconductor packages such as 2.5-dimensional (2.5D) and 3-dimensional (3D) packages in which a plurality of semiconductor chips is vertically stacked is being actively performed.

SUMMARY

Exemplary embodiments may provide a semiconductor device having a new structure that can reduce damage caused during a cutting process, and a semiconductor package having the same.

According to an exemplary embodiment, a semiconductor device includes a semiconductor substrate having a first surface and a second surface opposing each other, a plurality of semiconductor elements disposed on the first surface in a device region, an insulating protective layer, and a connection pad. The second surface is divided into a first region overlapping the device region, and a second region surrounding the first region. The insulating protective layer is disposed on the second surface of the semiconductor substrate, and includes an edge pattern positioned in the second region. The edge pattern includes a thinner portion having a thickness smaller than a thickness of a center portion of the insulating protective layer positioned in the first region and/or an open region exposing the second surface of the semiconductor substrate. The connection pad is disposed on the center portion of the insulating protective layer and is electrically connected to the semiconductor elements.

According to an exemplary embodiment, a semiconductor package includes a first semiconductor device having a lower surface on which a lower connection pad is disposed and an upper surface on which an upper connection pad is disposed, and including a through-electrode electrically connecting the lower connection pad and the upper connection pad. The semiconductor package further includes a second semiconductor device stacked on the upper surface of the first semiconductor device, and electrically connected to the upper connection pad. The first semiconductor device includes a semiconductor substrate having a first surface and a second surface facing the lower surface and the upper surface of the first semiconductor device, respectively. The first surface includes a device region, and the second surface is divided into a first region overlapping the device region, and a second region surrounding the first region. The first semiconductor device further includes a first wiring structure disposed on the first surface of the semiconductor substrate and electrically connecting the device region and the lower connection pad, and an insulating protective layer disposed on the second surface of the semiconductor substrate. The insulating protective layer includes an edge pattern positioned in the second region. The edge pattern includes a thinner portion having a thickness smaller than a thickness of a center portion of the insulating protective layer positioned in the first region and/or an open region exposing the second surface of the semiconductor substrate.

According to an exemplary embodiment, a semiconductor package includes a package substrate having a circuit pattern, a first semiconductor device disposed on the package substrate, having a lower surface on which a lower connection pad connected to the circuit pattern is disposed and an upper surface on which an upper connection pad is disposed, and including a through-electrode electrically connecting the lower connection pad and the upper connection pad, and a second semiconductor device stacked on the upper surface of the first semiconductor device, and electrically connected to the upper connection pad. The first semiconductor device includes a semiconductor substrate having a first surface and a second surface facing the lower surface and the upper surface of the first semiconductor device, respectively. The first surface includes a device region. The second surface is divided into a first region overlapping the device region, and a second region surrounding the first region. The first semiconductor device further includes a first wiring structure disposed on the first surface of the semiconductor substrate and electrically connecting the device region and the lower connection pad, and an insulating protective layer disposed on the second surface of the semiconductor substrate. The insulating protective layer includes an edge pattern positioned in the second region. The edge pattern includes a thinner portion having a thickness smaller than a thickness of a center portion of the insulating protective layer positioned in the first region and/or an open region exposing the second surface of the semiconductor substrate. The first semiconductor device further includes a second wiring structure disposed on the insulating protective layer. The second wiring structure includes the upper connection pad and is electrically connected to the device region through the through electrode.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION

Figure 1:
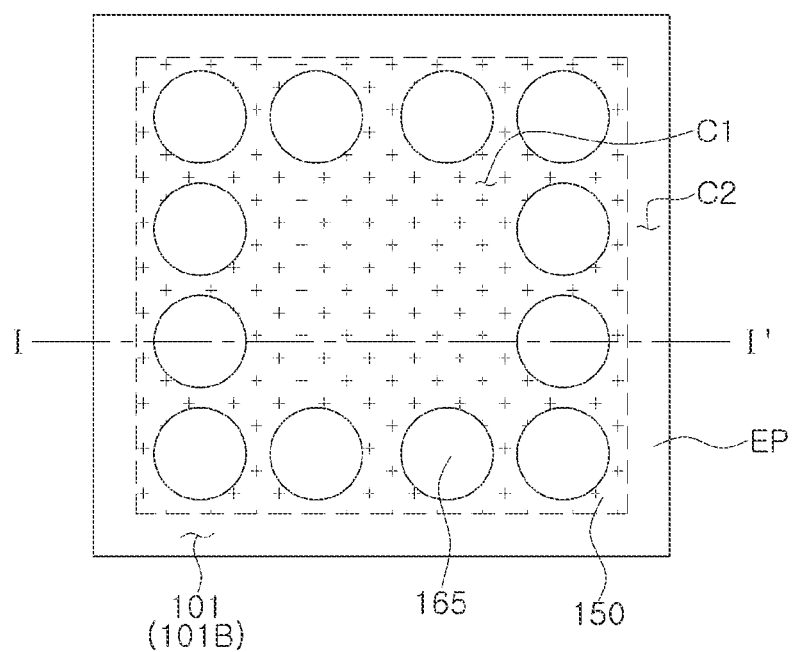
FIG. 1 is a lower plan view illustrating a semiconductor device according to an exemplary embodiment of the present inventive concept.

Exemplary embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationship between elements should be interpreted in a like fashion.

Figure 2:
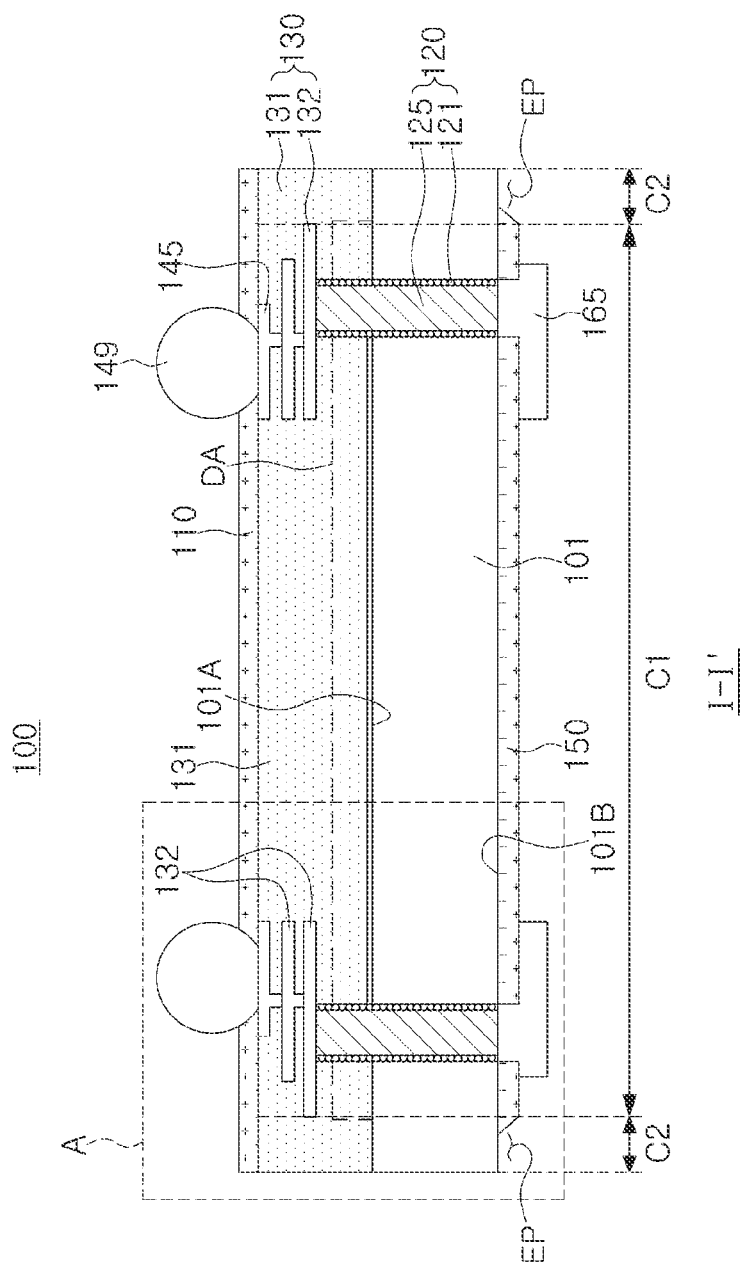
FIG. 2 is a cross-sectional view of the semiconductor device of FIG. 1 taken along line I-I' according to an exemplary embodiment of the present inventive concept.
Figure 3:
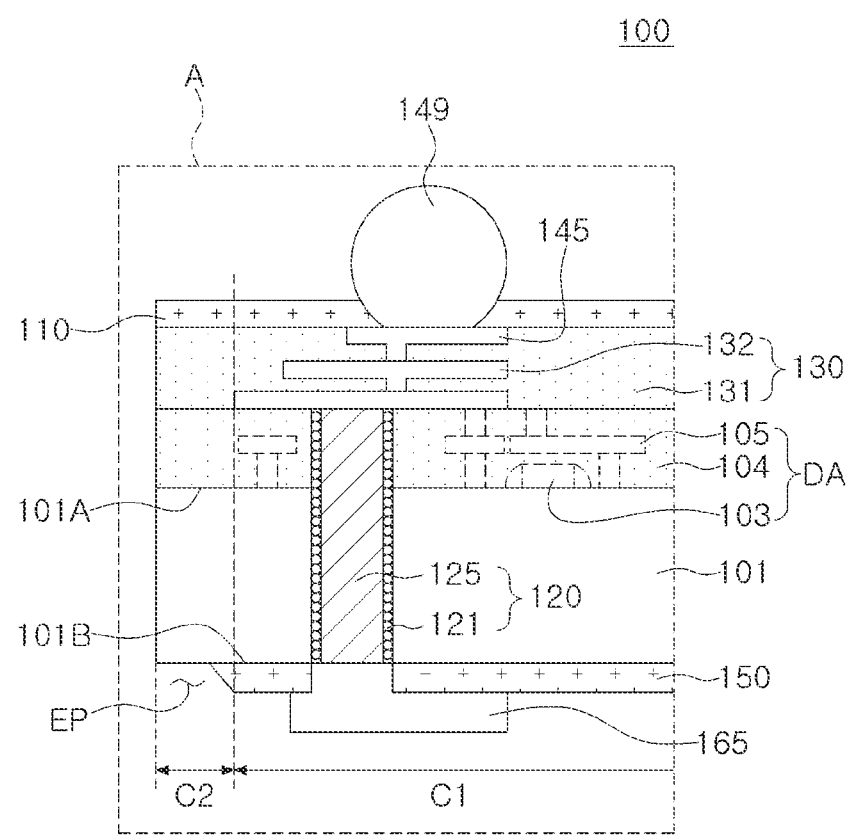
FIG. 3 is a partially enlarged view illustrating region A of the semiconductor device of FIG. 1 according to an exemplary embodiment of the present inventive concept.

FIG. 1 is a lower plan view illustrating a semiconductor device according to an exemplary embodiment of the present inventive concept. FIG. 2 is a cross-sectional view of the semiconductor device of FIG. 1 taken along line I-I'. FIG. 3 is a partially enlarged view illustrating region A of the semiconductor device of FIG. 1.

Referring to FIGS. 1 to 3, a semiconductor device 100 according to an exemplary embodiment may include a semiconductor substrate 101 having a first surface 101A and a second surface 101B opposing each other, and a wiring structure 130 disposed on the first surface 101A of the semiconductor substrate 101.

A device region DA may be provided on the first surface 101A of the semiconductor substrate 101. As shown in FIG. 3, the device region DA may include a plurality of semiconductor elements 103 including, for example, a transistor, and some regions of the first surface 101A of the semiconductor substrate 101 in which an interconnection portion 105 electrically connected to the semiconductor elements 103 is disposed. An interlayer insulating film 104 covering the semiconductor elements 103 and the interconnection portion 105 is formed on the first surface 101A of the semiconductor substrate 101. For example, the semiconductor substrate 101 may include a semiconductor such as Si or Ge, or a compound semiconductor such as SiGe, SiC, GaAs, InAs, or InP.

The wiring structure 130 may include a dielectric layer 131 disposed on the interlayer insulating film 104, and a metal wiring 132 disposed in the dielectric layer 131 and connected to the interconnection portion 105. The metal wiring 132 may be electrically connected to the semiconductor elements 103 through the interconnection portion 105. For example, the wiring structure 130 may be disposed on the first surface 101A of the semiconductor substrate 101 and may be electrically connected to the device region DA.

For example, the interlayer insulating film 104 and/or the dielectric layer 131 may include a silicon oxide or a silicon oxide-based insulating material, such as, for example, TetraEthyl Ortho Silicate (TEOS), Undoped Silicate Glass (USG), PhosphoSilicate Glass (PSG), Borosilicate Glass (BSG), BoroPhosphoSilicate Glass (BPSG), Fluoride Silicate Glass (FSG), Spin On Glass (SOG), Tonen SilaZene (TOSZ), or a combination thereof. For example, the interconnection portion 105 and/or the metal wiring 132 may include copper or a copper containing alloy.

A first insulating protective layer 110 may be disposed on the wiring structure 130. For example, the first insulating protective layer 110 may include a silicon oxide or a silicon oxide-based insulating material. A first connection pad 145 is disposed in the dielectric layer 131 and is connected to the metal wiring 132. The first connection pad 145 may also be referred to as a lower connection pad. A portion of regions of the first connection pad 145 may be exposed from the first insulating protective layer 110, and may include the connection terminal 149 disposed in the exposed region of the first connection pad 145. For example, the connection terminal 149 may have a solder ball, bump or pillar shape.

In an exemplary embodiment, a second insulating protective layer 150 may be disposed on the second surface 101B of the semiconductor substrate 101. For example, the second insulating protective layer 150 may include a silicon oxide or a silicon oxide-based insulating material, similar to the first insulating protective layer 110.

The second surface 101B of the semiconductor substrate 101 may have a first region C1 overlapping the device region DA in a thickness direction of the semiconductor substrate 101, and a second region C2 surrounding the first region C1. For example, the second region C2 may entirely surround the first region C1. For example, in a plan view, as shown in FIG. 1, the second region C2 may form a frame shape around the first region C1. For example, the first region C1 may correspond to the device region DA (e.g., the device region DA may be disposed in the first region C1). For example, the second surface 101B may be divided into the first region C1 which overlaps the device region DA, and the second region C2 which surrounds the first region C1. The second insulating protective layer 150 may have an upper surface that is substantially flat (e.g., exactly flat, or approximately flat within a measurement error as would be understood by one having ordinary skill in the art) in the first region C1, and may have an edge pattern EP in which an entirety or a part thereof is removed (e.g., forming an open region) and/or in which a thickness thereof is reduced (e.g., a thinner portion) in an edge portion of the second insulating protective layer 150 corresponding to the second region C2. For example, the edge pattern EP of the second insulating protective layer 150 may be positioned in the second region C2, and the edge pattern EP may include a thinner portion having a thickness smaller than a thickness of a center portion of the second insulating protective layer 150 positioned in the first region C1 and/or an open region (e.g., a region in which an entirety or a part of the second insulating protective layer 150 is removed) exposing the second surface 101B of the semiconductor substrate 101.

Figure 4:
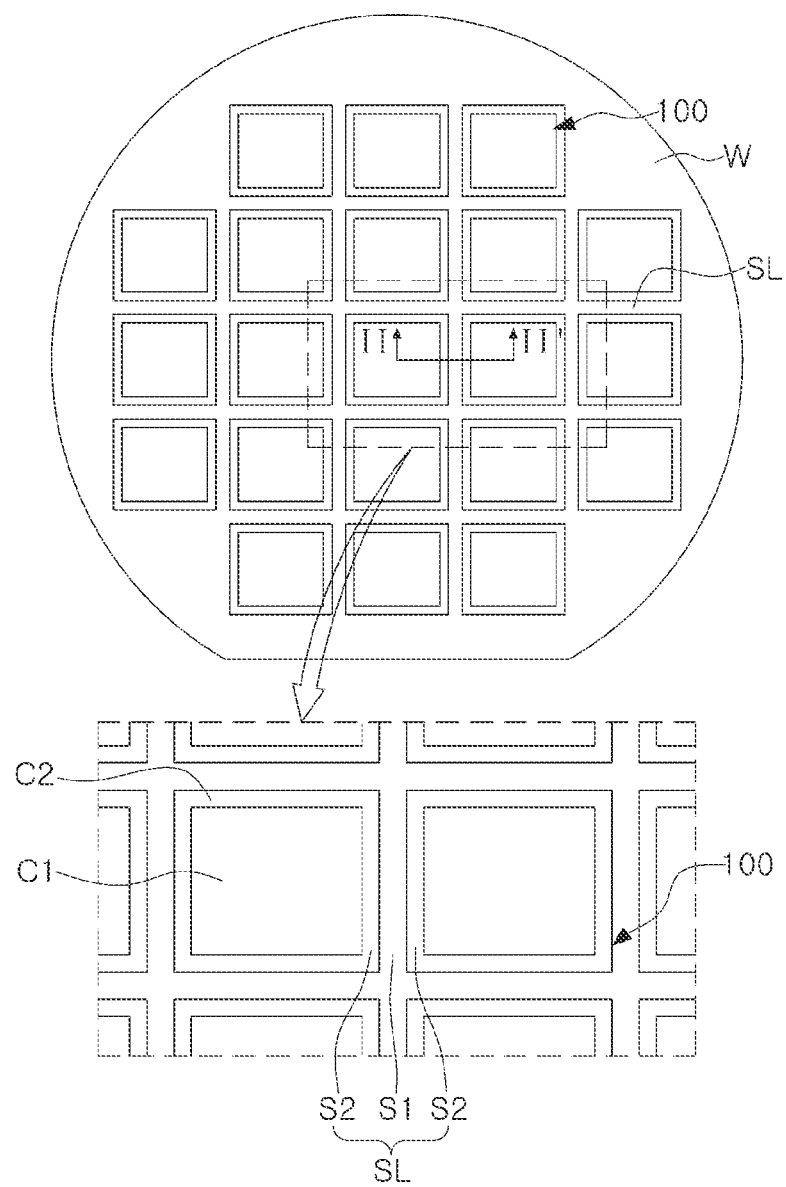
FIG. 4 is a plan view illustrating a wafer in which a plurality of semiconductor elements according to an exemplary embodiment of the present inventive concept is implemented.
Figure 5:
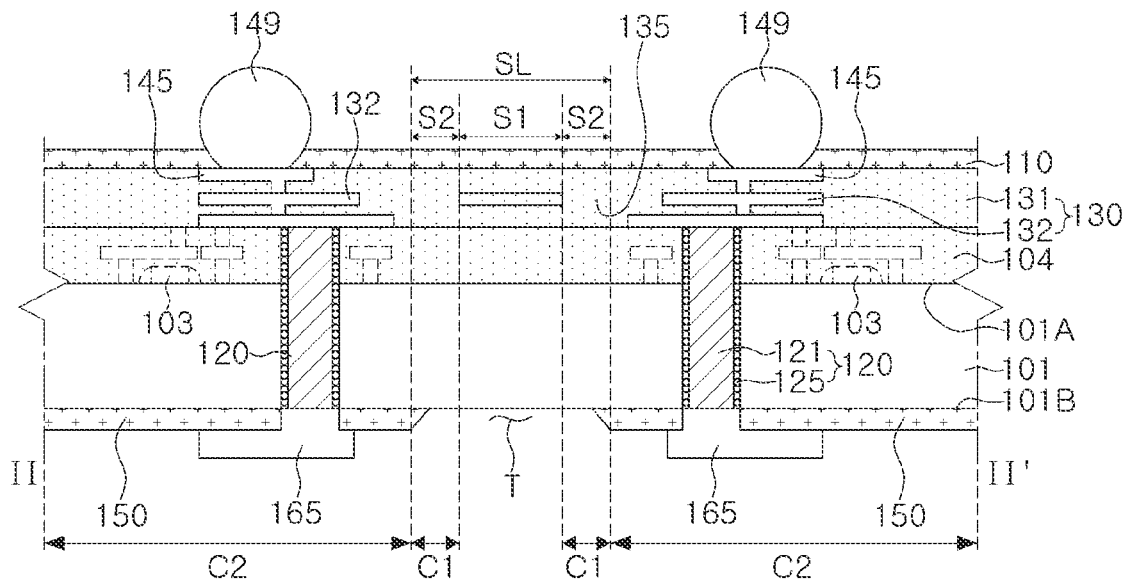
FIG. 5 is a partial cross-sectional view taken along line II-II' of the wafer of FIG. 4 according to an exemplary embodiment of the present inventive concept.

The second region C2 on the second surface 101B of the semiconductor substrate 101 is a region which does not overlap the device region DA, and the edge pattern EP may correspond to a part of a scribe lane at the wafer level (see FIGS. 4 and 5).

The edge pattern EP employed in an exemplary embodiment may be an open region in which the second insulating protective layer 150 is removed from the second region C2 to expose the second surface 101B of the semiconductor substrate 101. As shown in FIG. 1, the open region of the edge pattern EP may be formed along an edge of the second surface 101B, and the open region may surround the first region C1.

As described above, the edge pattern EP employed in an exemplary embodiment may be illustrated as an open region exposing the second surface 101B of the semiconductor substrate 101. However, the inventive concept is not limited thereto. For example, in an exemplary embodiment, the edge pattern EP may be a pattern that makes the thickness of the portion of the insulating protective layer 150 positioned in the second region C2 thinner than the thickness of the portion positioned in the first region C1 (see FIGS. 2 and 8).

The edge pattern EP may be a portion of regions of a scribe lane in which the scribe lane provided at a wafer level remains at a chip level after a cutting process into individual chips. The scribe lane employed in an exemplary embodiment may be formed by reducing the thickness of the second insulating protective layer 150 or removing the second insulating protective layer 150.

The edge pattern EP may be positioned in the second region C2 and may also be used to provide stress relaxation for protecting a backside wiring layer positioned in the device region DA and the first region C1 during a cutting process. For example, the edge pattern EP may be a discontinuous structure positioned between a region to be cut (for example, Si of FIG. 4), and may block a stress generated during the cutting process that may propagate to the device region DA.

In addition, in an exemplary embodiment, a second connection pad 165 may be disposed on a portion of the second insulating protective layer 150 positioned in the first region C1, and may be electrically connected to the semiconductor elements 103 disposed in the device region DA. The second connection pad 165 may also be referred to as an upper connection pad. For example, the second connection pad 165 may be disposed on a center portion of the insulating protective layer 150 positioned in the first region C1. As illustrated in FIGS. 1 to 3, the second connection pad 165 may be connected to a through-electrode 120 penetrating the semiconductor substrate 101. The through-electrode 120 may include a conductive material 125 and an insulating barrier 121 disposed between the conductive material 125 and the semiconductor substrate 101. For example, the conductive material 125 may include Cu, Co, Mo, Ru, W, or an alloy thereof. For example, the insulating barrier 121 may include $SiO_2$, SiN, SiCN, SiC, SiCOH, SiON, $Al_2O_3$, AN, or a porous material thereof.

The through-electrode 120 may be electrically connected to the device region DA, that is, an interconnection portion 105 and an integrated circuit 103, through a metal wiring 132 of the wiring structure 130. Thus, the second connection pad 165 may be electrically connected to the device region DA. Thus, the through-electrode 120 may electrically connect the semiconductor elements 103 and the second connection pad 165.

FIG. 4 is a lower plan view illustrating a wafer in which a plurality of semiconductor elements according to an exemplary embodiment of the present inventive concept is implemented. FIG. 5 is a partial cross-sectional view taken along line II-II' of the wafer of FIG. 4 according to an exemplary embodiment.

Referring to FIG. 4, a wafer W may include a plurality of semiconductor devices 100 (which include a plurality of semiconductor elements 103) arranged in a matrix form and a plurality of scribe lanes SL separating the plurality of semiconductor devices 100.

The device regions DA of the semiconductor device 100 may be surrounded by the scribe lanes SL. Therefore, the scribe lanes SL may be spaced apart from each other by the device regions DA of the semiconductor devices 100. As described above, the device regions DA may include integrated circuits 103 formed by a semiconductor process. For example, integrated circuits 103 may include logic circuits, memory circuits, or a combination thereof.

The scribe lanes SL are provided as a dicing region for separating the semiconductor devices 100 formed on the wafer W.

As illustrated in FIG. 5, a scribe lane SL employed in an exemplary embodiment may be provided as a trench T(e.g., an opening) formed in the second surface 101B of the semiconductor substrate 101 by removing the second insulating protective layer 150. The trench T may be provided as the thinner portion and/or the open region of the edge pattern EP described above. A cross-section illustrated in FIG. 5 is a cross-section of the wafer W taken along II-II' as described above, and can be understood as a part of the wafer W for obtaining the semiconductor device 100 shown in FIG. 1.

The trench T for the scribe lane SL may be formed together in a process of forming an open region for a second connection pad 165 in the second insulating protective layer 150 without an additional process.

The scribe lanes SL may include various metal patterns 135 used for a semiconductor process or a packaging process as a free space of the wafer W. For example, the metal pattern 135 may include a test wiring pattern, a TEG, and/or an alignment key.

In an exemplary embodiment, a structure may be provided that not only provides an improved degree of precision of the cutting process, but also can prevent mechanical damage such as, for example, backside chipping or cracking during the cutting process. This may be accomplished, for example, by forming the scribe lane SL using the second insulating protective layer 150 on the second surface 101B corresponding to a backside of the semiconductor device in addition to the scribe lane SL positioned on a front side of the semiconductor device 100.

By cutting the semiconductor devices 100 along the scribe lanes SL from one wafer W, a cutting process separating the semiconductor devices 100 from each other may be performed, respectively. For example, the cutting process may be performed using a cutting means such as a laser, a blade, or plasma.

Each scribe lane SL includes a kerf region Si which is a region to be cut by the cutting process, and a buffer region S2 positioned between the kerf region S1 and the device region DA. In exemplary embodiments, the kerf region Si may be disposed with a preliminary pattern or a material for cutting to perform cutting quickly and efficiently.

In the cutting process, the kerf region Si of the scribe lane SL may be removed, and the buffer region S2 may remain as an edge region (e.g., the second region C2) surrounding each device region DA. As a result, backsides of the plurality of semiconductor devices 100 (e.g., the second surface 101B of the semiconductor substrate 101) may include a first region C1 overlapping the device region DA and a second region C2 surrounding the device region DA. The semiconductor device 100 obtained after cutting (see 100 in FIGS. 1 to 3) has an edge pattern EP obtained from the trench T in the second region C2. The trench T at the wafer level (see FIG. 5), or the edge pattern EP at the chip level (see FIG. 1) may act as a discontinuous structure for blocking propagation of stress (or cracking) generated in the cutting process to the device region DA.

As such, a trench T (or an edge pattern EP) may be introduced in the second insulating protective layer 150 positioned on the second surface 101B of the semiconductor substrate 101, which may be vulnerable to damage such as chipping, such that it is possible to reduce the damage of the semiconductor device 100 during the cutting process.

In the above-described exemplary embodiment, a scribe lane SL providing the edge pattern EP is illustrated in the form of a trench T exposing the second surface 101B of the semiconductor substrate 101, but various other forms are also illustrated. For example, the scribe lanes SL may be formed in a manner to reduce the thickness of the second insulating protective layer 150. By using the thickness variation, visibility of the edge pattern EP may be secured. The edge pattern EP may be formed of a plurality of trenches (see FIGS. 7A and 7B), or may have various other shapes such as convex structures or concave patterns such as dot shapes (see FIGS. 12 and 13).

Figure 6:
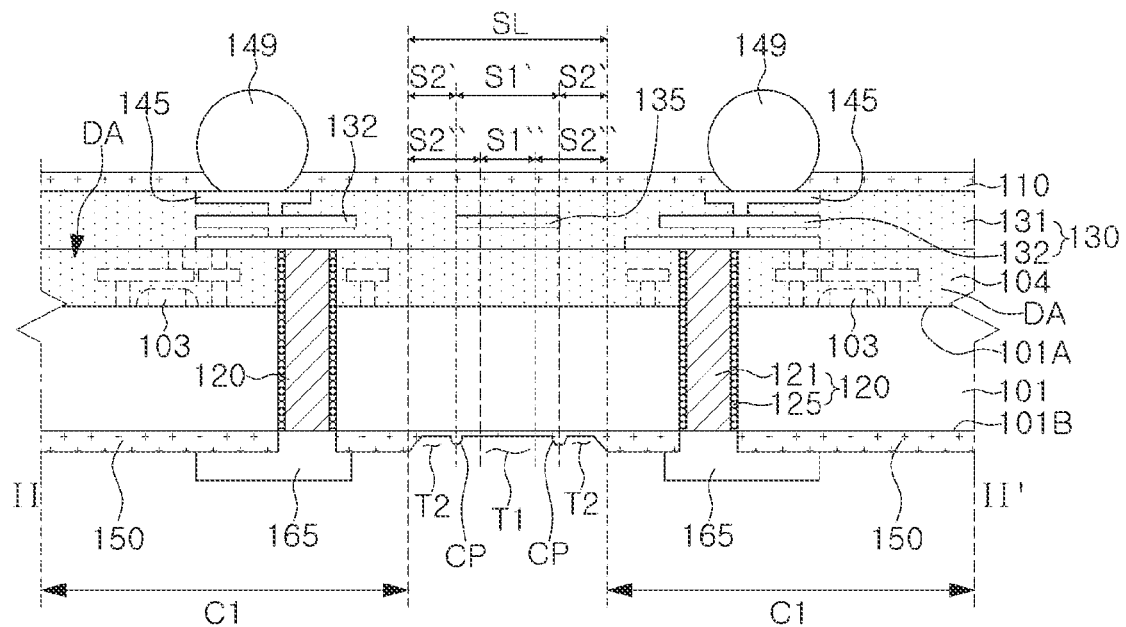
FIG. 6 is a partial cross-sectional view taken along line II-II' of the wafer of FIG. 4 according to an exemplary embodiment of the present inventive concept.

FIG. 6 is a partial cross-sectional view taken along line II-II' of the wafer of FIG. 4 according to an exemplary embodiment.

Referring to FIG. 6, the wafer W according to an exemplary embodiment has a similar structure as the wafers W shown in FIGS. 4 and 5, except for having a scribe lane SL including a plurality of trenches T1 and T2, and forming the scribe lane SL using the thickness of the second insulating protective layer 150. For convenience of explanation, a further description of elements and technical aspects previously described may be omitted.

The scribe lane SL employed in an exemplary embodiment may include a first trench T1 and second trenches T2 disposed on both sides of the first trench T1. The second trenches T2 may be positioned between the first trench Ti and the first region C1 overlapping the device region DA. In an exemplary embodiment, line-shaped convex portions CP may be disposed between the first and second trenches T1 and T2, respectively.

In an exemplary embodiment, the first and second trenches Ti and T2 may be provided in a manner in which the thickness of the second insulating protective layer 150 is reduced, and the convex portions CP may be provided as a region in which the second insulating protective layer 150 is not removed or is less removed, and may have a thickness greater than the thickness of the portion of the second insulating protective layer 150 positioned on bottom surfaces of the first and second trenches T1 and T2. By using the thickness deviation, visibility of the scribe lane SL may be secured. In exemplary embodiments, to secure the visibility, the second insulating protective layer 150 may be formed of a non-transparent material (e.g., an opaque or translucent material).

Figure 7A:
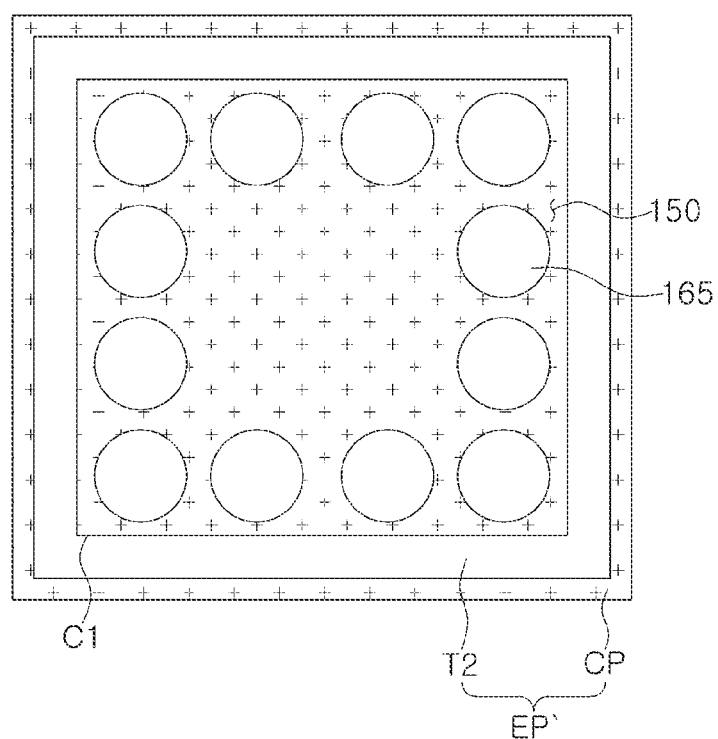
FIGS. 7A and 7B are lower plan views illustrating various examples of a semiconductor device obtained by cutting the wafer of FIG. 6.
Figure 7B:
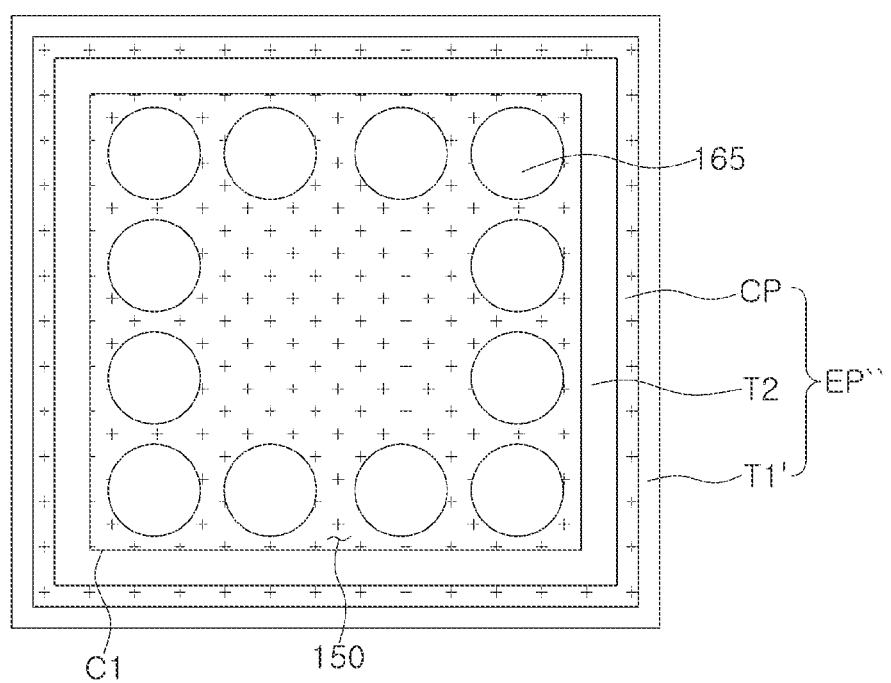

After the cutting process, the edge pattern remaining in the semiconductor device 100 may have a different structure depending on the width of the kerf region removed in the cutting process. In the wafer W shown in FIG. 6, two kerf regions S1' and S1" having different widths are shown, and edge patterns EP' and EP'" having different structures obtained after the cutting process are illustrated in FIGS. 7A and 7B. FIGS. 7A and 7B are plan views illustrating semiconductor devices obtained from the wafer W illustrated in FIG. 6.

When the region removed in the cutting process is a first kerf region S1' in the wafer W illustrated in FIG. 6, a first buffer region S2' may be provided as an edge region of a semiconductor device 100A'.

Referring to FIG. 7A, the second insulating protective layer 150 of the semiconductor device 100A' may have a first edge pattern EP' obtained from the first buffer region S2'. The first edge pattern EP' may include a line-shaped convex portion CP formed along the edge of the backside, and a second trench T2 positioned between the convex portion CP and the first region C1. For example, the edge pattern EP' may surround the first region C1, and may include the convex portion CP disposed along the edge of the second surface 101B of the semiconductor substrate 101.

When the region removed in the cutting process is a second kerf region Si" in the wafer W illustrated in FIG. 6, the second buffer region S2" may be provided as an edge region of the semiconductor device 100A".

Referring to FIG. 7B, the second insulating protective layer 150 of the semiconductor device 100A" may have a second edge pattern EP" obtained from the first buffer region ST. The second edge pattern EP" may include a first trench Ti' formed along an edge of the backside of the semiconductor device 100A", a second trench T2 adjacent to the first region C1, and a line-shaped convex portion CP positioned between the first and second trenches Ti' and T2.

As such, even if the same wafer is provided, an edge pattern having a different structure depending on the width of the kerf region may be provided. In the above-described exemplary embodiment, it is illustrated that one semiconductor device has a shape having an edge pattern of the same shape in four edge regions, but when cutting process conditions according to the scribe lane are different, a portion of four edge regions of the semiconductor devices may have an edge pattern of a structure that is different from some other edge patterns.

Figure 8:
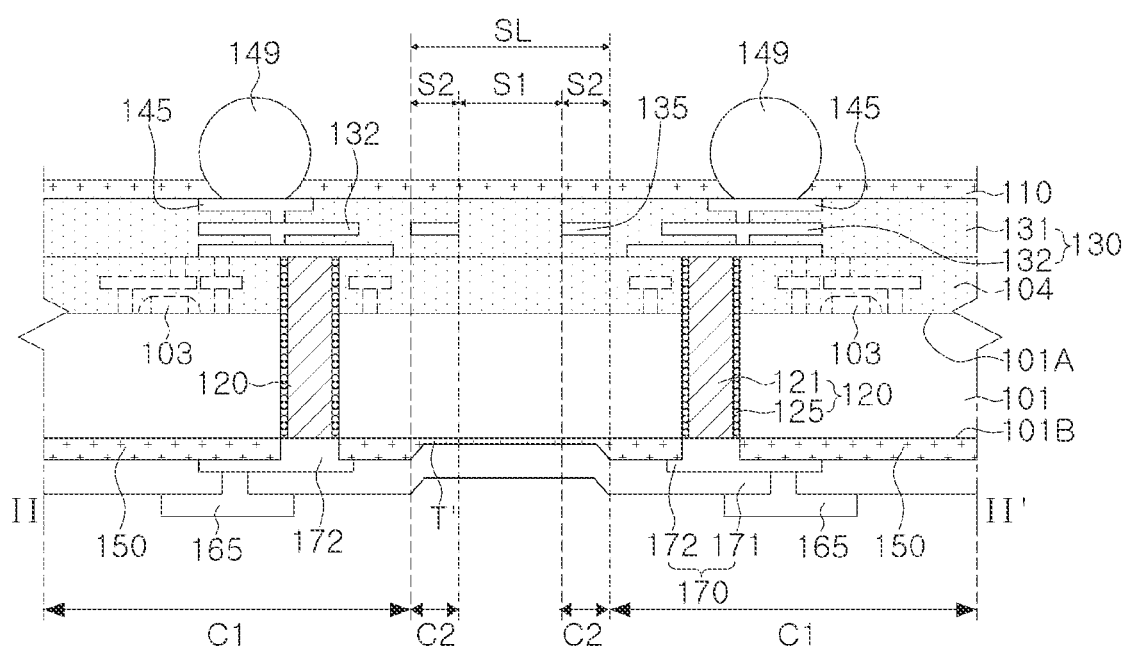
FIG. 8 is a partial cross-sectional view taken along line II-II' of the wafer of FIG. 4 according to an exemplary embodiment of the present inventive concept.

FIG. 8 is a partial cross-sectional view taken along line II-II' of the wafer of FIG. 4 according to an exemplary embodiment.

Referring to FIG. 8, the wafer W according to an exemplary embodiment has a structure similar to the wafers W shown in FIGS. 4 and 5, except for having an alignment key (see AK in FIG. 9) and forming a scribe lane SL using a thickness of the second insulating protective layer 150. For convenience of explanation, a further description of elements and technical aspects previously described may be omitted.

A trench T' employed in an exemplary embodiment may be obtained by reducing the thickness of a portion of the second insulating protective layer 150 positioned on the backside of the wafer W. The trench T' may be provided to the scribe lane SL. Additional patterns such as alignment keys AK may be additionally formed in the scribe lane SL.

Figure 9:
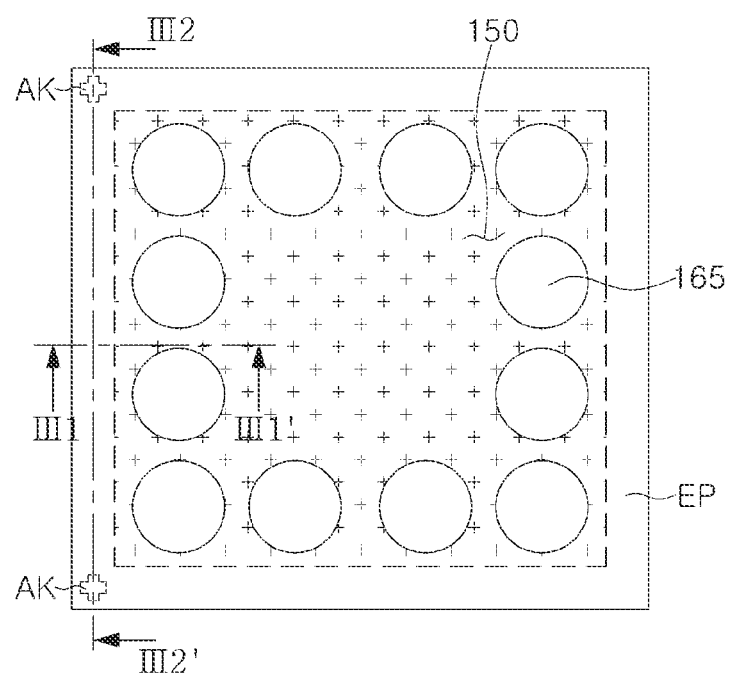
FIG. 9 is a lower plan view illustrating an example of a semiconductor device obtained by cutting the wafer of FIG. 8.
Figure 10A:
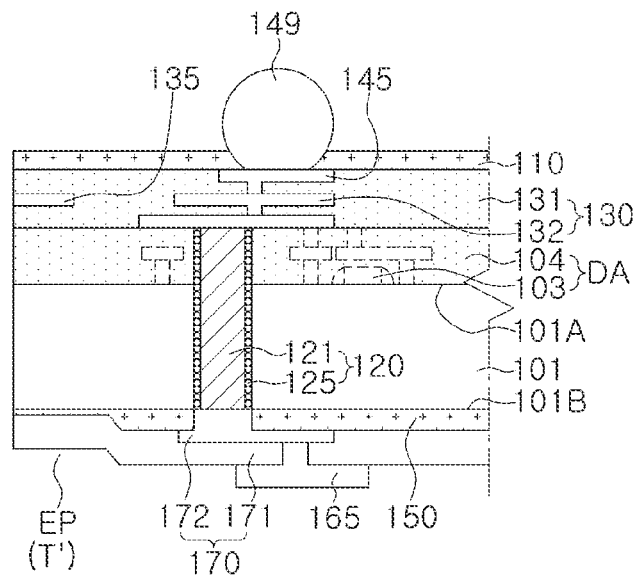
FIGS. 10A and 10B are cross-sectional views of the semiconductor device of FIG. 9 taken along lines 1111-1111' and 1112-1112', respectively, according to an exemplary embodiment of the present inventive concept.
Figure 10B:
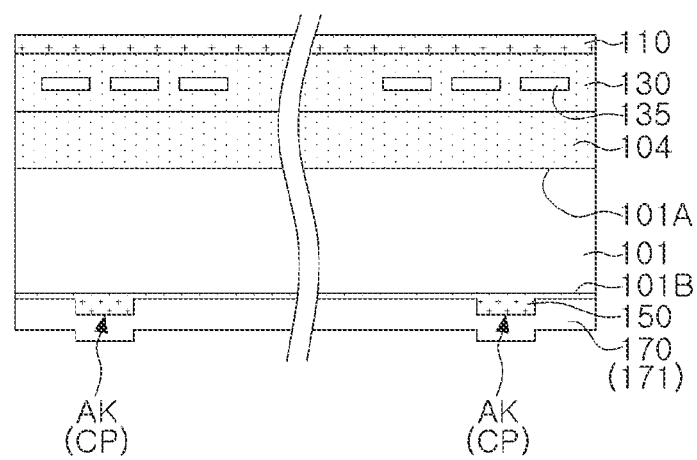

FIG. 9 is a lower plan view illustrating an example of a semiconductor device 100B obtained by cutting the wafer of FIG. 8. FIGS. 10A and 10B are cross-sectional views of the semiconductor device 100B of FIG. 9 taken along lines 1111-1111' and 1112-1112', respectively.

Referring to FIGS. 10A and 10B together with FIG. 9, an edge pattern EP obtained from the trench T' may be provided in the edge region (or the second region C2) of the backside of the semiconductor device 100B. A cross-shaped alignment key AK may be disposed at both corners of the edge pattern EP positioned in one edge region. As shown in FIG. 10B, the alignment key AK may be a convex pattern obtained as a portion remaining without etching the second insulating protective layer 150. In exemplary embodiments, the alignment keys AK may be disposed in different numbers at different positions, and may have various other shapes in a plan view such as, for example, a circle and a rectangle.

The alignment key AK may be used in a stacked semiconductor package in which the backside of the semiconductor device 100B (or the second surface 101B of the semiconductor substrate 101) faces upwardly. For example, in a stacked semiconductor package (see FIGS. 15 and 17) such as a high bandwidth memory (HBM) device, the backside of the semiconductor chip may be disposed to face upward, and the alignment key AK employed in an exemplary embodiment when stacking other semiconductor chips may be used.

As such, not only the scribe lane SL, but also additional patterns such as the alignment key AK, may be provided as a non-flat element processed by the second insulating protective layer 150 positioned at the backside of the semiconductor device 100B, and an edge pattern of a final semiconductor device obtained after the cutting process may include at least a portion of the alignment key AK.

Figure 11:
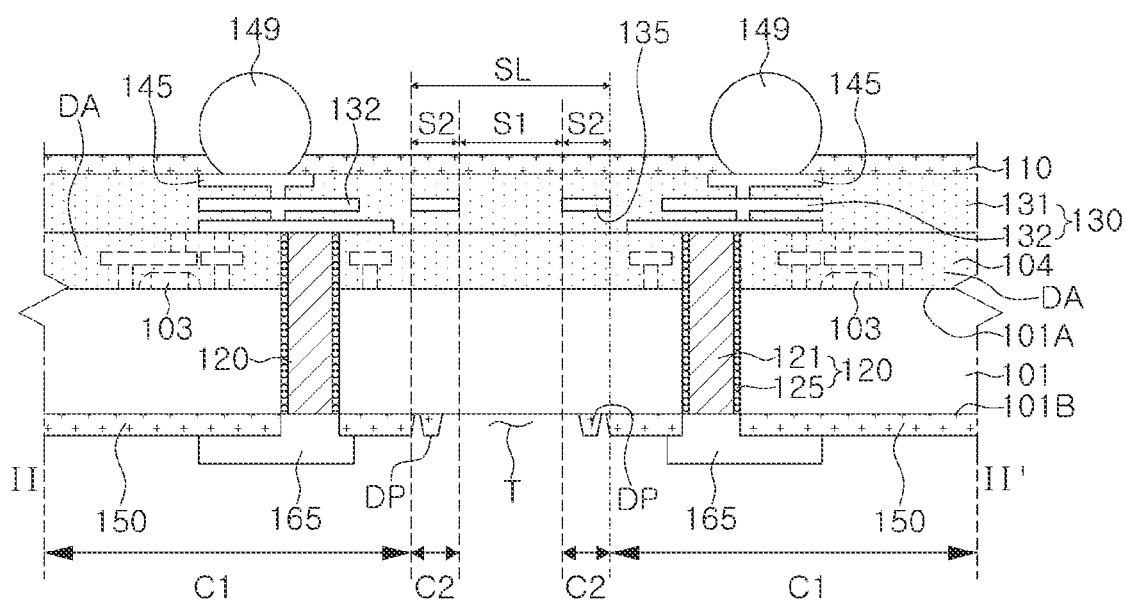
FIG. 11 is a partial cross-sectional view taken along line II-II' of the wafer of FIG. 4 according to an exemplary embodiment of the present inventive concept.
Figure 12:
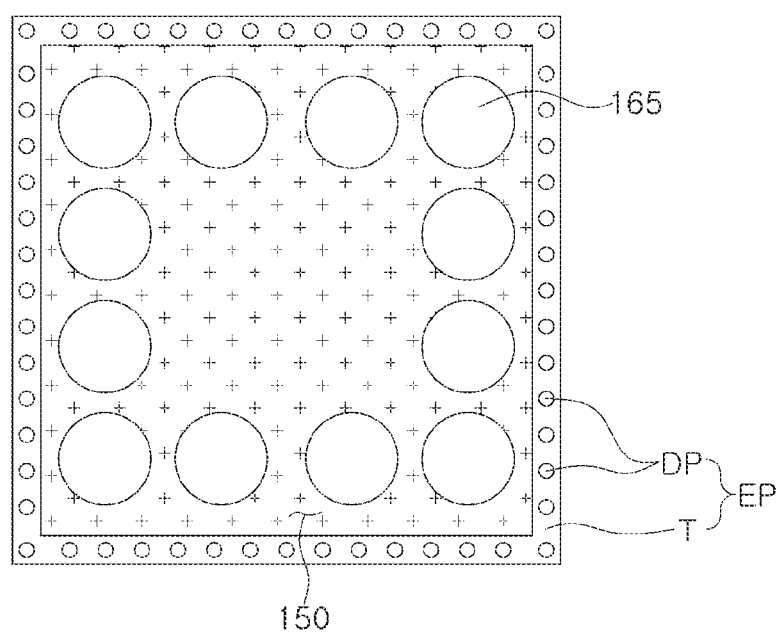
FIG. 12 is a lower plan view illustrating an example of a semiconductor device obtained by cutting the wafer of FIG. 11.

FIG. 11 is a partial cross-sectional view taken along line II-II' of the wafer of FIG. 4 according to an exemplary embodiment of the present inventive concept. FIG. 12 is a plan view illustrating an example of a semiconductor device obtained by cutting the wafer of FIG. 11.

Referring to FIG. 11, the wafer W according an exemplary embodiment has a structure similar to the wafer W shown in FIGS. 4 and 5, except for forming a plurality of convex structures DP together with the trench T. For convenience of explanation, a further description of elements and technical aspects previously described may be omitted.

The scribe lane SL employed in an exemplary embodiment may include a trench T formed as an open region, and the plurality of convex structures DP surrounding the first region C1 on both sides of the trench T. The convex structures DP may be arranged in the second region C2 and may provide stress relaxation for protecting the device region DA and the backside wiring layer (see 172 of FIG. 14) during the cutting process. For example, the plurality of convex structures DP used in an exemplary embodiment may be a discontinuous structure that can effectively block the stress generated in the cutting process from propagating to the device region DA.

In the cutting process, the kerf region S1 may be removed from the wafer W illustrated in FIG. 11, and the buffer region S2 may be provided as an edge region of the semiconductor device 100C.

Referring to FIG. 12, the second insulating protective layer 150 of the semiconductor device 100C may have an edge pattern EP obtained from the buffer region S2. The edge pattern EP employed in an exemplary embodiment may include a trench T formed along an edge of the backside of the semiconductor device 100C, and the plurality of convex structures DP positioned in the trench T and surrounding the first region C1. Each of the convex structures DP is illustrated as a circular shape having the same size in a plan view, but is not limited thereto. For example, the convex structures DP may have various shapes, such as a quadrangle and a cross, and may have patterns of different sizes. For example, the open region corresponding to the trench T may surround the first region C1, and the convex structures DP of the edge pattern EP may be arranged in the open region. The convex structures DP may include the same material as the second insulating protective layer 150. The convex structures DP may be arranged in a plurality of rows to surround the first region C1. For example, in an exemplary embodiment, in a plan view, the convex structures DP may include a left row, a top row, a right row, and a bottom row surrounding the first region C1. In an exemplary embodiment, a plurality of rows of convex structures DP may be formed in each of the left row, the top row, the right row, and the bottom row surrounding the first region C1 (e.g., in a manner similar to the concave patterns H1 and H2 illustrated in FIG. 13).

Figure 13:
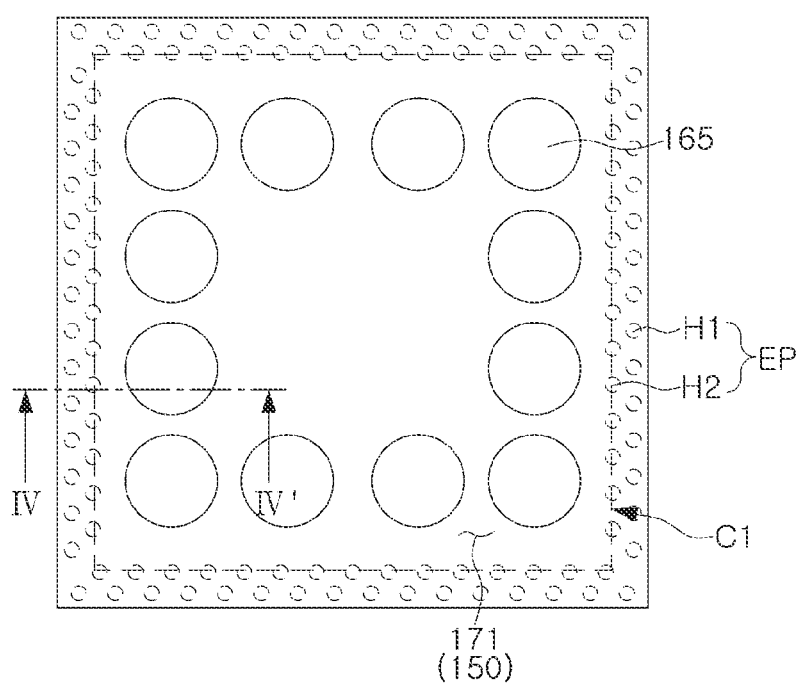
FIG. 13 is a lower plan view illustrating a semiconductor device according to an exemplary embodiment of the present inventive concept.
Figure 14:
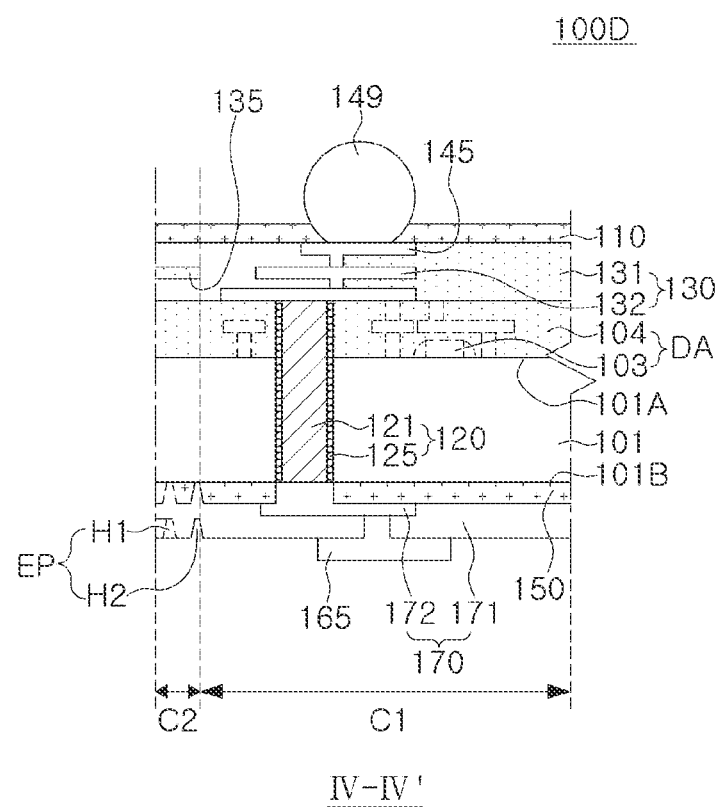
FIG. 14 is a cross-sectional view taken along line IV-IV' of the semiconductor device of FIG. 13 according to an exemplary embodiment of the present inventive concept.

FIG. 13 is a plan view illustrating a semiconductor device according to an exemplary embodiment of the present inventive concept. FIG. 14 is a cross-sectional view taken along line IV-IV' of the semiconductor device of FIG. 13.

Referring to FIGS. 13 and 14, a semiconductor device 100D according to an exemplary embodiment has a similar structure to the semiconductor device 100 shown in FIGS. 1 to 3, except that the semiconductor device 100D is formed of a plurality of concave patterns H1 and H2, partially overlaps the device region DA, and includes a second wiring structure 170. For convenience of explanation, a further description of elements and technical aspects previously described may be omitted.

The edge pattern EP employed in an exemplary embodiment may include the plurality of concave patterns H1 and H2 arranged in the second insulating protective layer 150 to surround the first region C1 overlapping the device region DA. The plurality of concave patterns H1 and H2 may be a plurality of holes formed in the second insulating protective layer 150. To improve a stress blocking effect, the plurality of concave patterns H1 and H2 may be arranged in a plurality of rows in the width direction of the second region C2. Additionally, the first concave patterns H1 may be arranged to cross the second concave patterns H2.

In addition, the edge pattern EP may be arranged to partially overlap the device region DA. That is, a portion of the edge pattern EP may also be positioned in the first region C1. For example, as shown in FIG. 13, a portion of the second concave patterns H2 of the plurality of concave patterns H1 and H2 may be arranged in the first region C1. Since the edge pattern EP is formed in the second insulating protective layer 150 disposed on the backside of the semiconductor device 100D, that is, on the first surface 101A of the semiconductor substrate 101, and not on the front side of the semiconductor device 100D adjacent to the first surface 101A disposed in the device region DA, it may be partially extended to the first region C1 in a range that does not contact a second connection pad 165. For example, the edge pattern EP may include a portion extending into the first region C1, and the extended portion may be spaced apart from the second connection pad 165.

According to exemplary embodiments, each of the plurality of concave patterns H1 and H2 is not limited to a circle in a plan view, but rather, may have various other shapes such as, for example, a quadrangular and a cross shape, and may have shapes in which patterns of different shapes may be combined.

As shown in FIG. 14, the semiconductor device 100D according to an exemplary embodiment may further include a second wiring structure 170 disposed between the second insulating protective layer 150 and the second connection pad 165. The second wiring structure 170 may electrically connect the through-electrode 120 and the second connection pad 165. For example, the second wiring structure 170 may include a metal wiring 172 (also referred to as a backside wiring layer) electrically connecting the through-electrode 120 and the second connection pad 165, and a dielectric layer 171 disposed on the second insulating protective layer 150 and covering the metal wiring 172. The dielectric layer 171 of the second wiring structure 170 may fill the open region and/or the thinner portion of the edge pattern EP described above. The dielectric layer 171 may include a material different from that of the second insulating protective layer 150. The dielectric layer 171 may include a material having light transmissivity to ensure visibility of the edge pattern EP. For example, the dielectric layer 171 may include a silicon oxide or a silicon oxide-based low dielectric material.

In an exemplary embodiment, the second wiring structure 170 employed in an exemplary embodiment may illustrate a single layer of metal wiring 172. In an exemplary embodiment, the second wiring structure 170 may include a plurality of metal wirings and a plurality of dielectric layers. In addition, the plurality of convex structures DP of the semiconductor device 100C shown in FIG. 12 may also be arranged in a plurality of rows, such as the concave patterns H1 and H2 shown in FIG. 13, and the convex structures DP may also be arranged in a plurality of rows to cross each other.

In an exemplary embodiment, the concave patterns H1 and H2 may be formed in the second insulating protective layer 150, and each of the concave patterns H1 and H2 may be provided as the thinner portion and/or the open region of the edge pattern EP described above.

Figure 15:
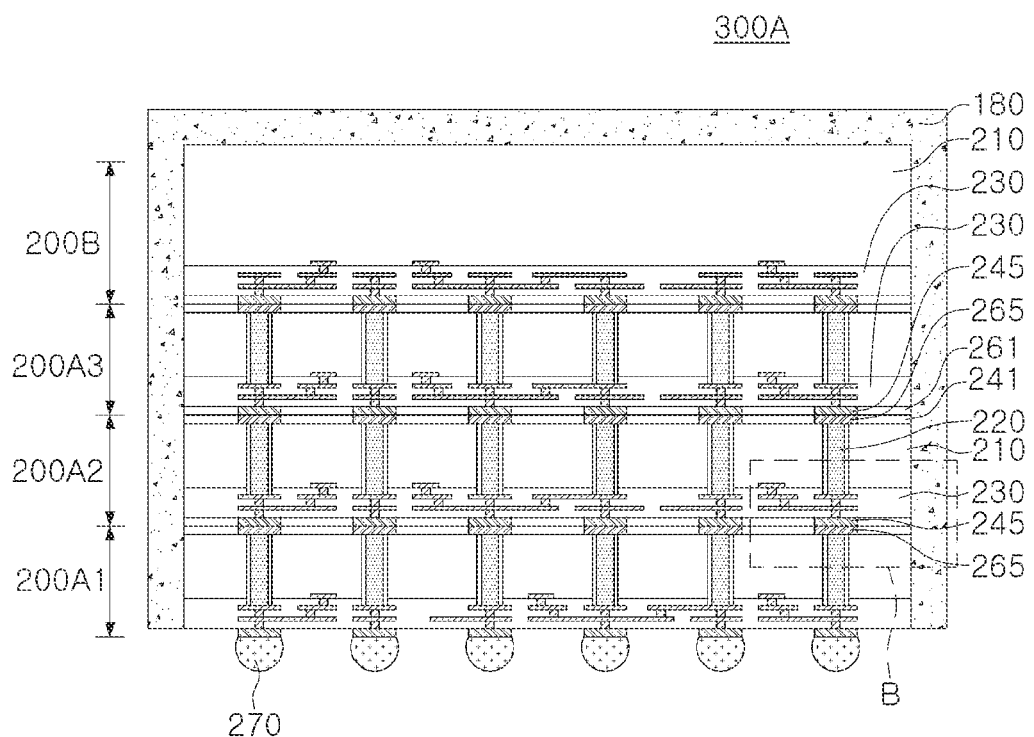
FIG. 15 is a cross-sectional view illustrating a semiconductor package according to an exemplary embodiment of the present inventive concept.
Figure 16:
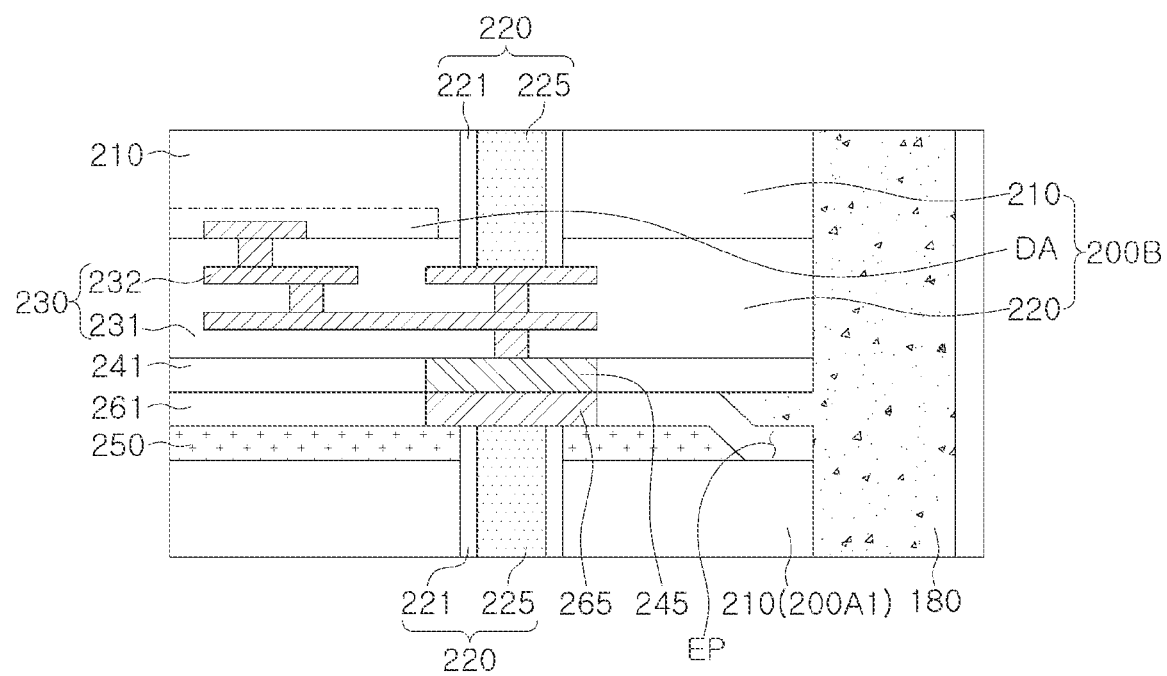
FIG. 16 is a partially enlarged view illustrating region B of the semiconductor package of FIG. 15 according to an exemplary embodiment of the present inventive concept.

FIG. 15 is a cross-sectional view illustrating a semiconductor package according to an exemplary embodiment of the present inventive concept. FIG. 16 is a partially enlarged view illustrating region B of the semiconductor package of FIG. 15.

Referring to FIG. 15, a semiconductor package 300A according to an exemplary embodiment may include a plurality of first semiconductor chips 200A1, 200A2, and 200A3 stacked in a vertical direction, and a second semiconductor chip 200B disposed above the plurality of first semiconductor chips 200A1, 200A2, and 200A3. The plurality of first semiconductor chips 200A1, 200A2, and 200A3 may also be referred to as a plurality of first semiconductor devices.

The plurality of first semiconductor chips 200A1, 200A2, and 200A3 and the second semiconductor chip 200B may have lower surfaces (also referred to as first surfaces) and upper surfaces (also referred to as second surfaces) opposite each other, respectively, and may be stacked such that different surfaces (that is, the first and second surfaces) face each other. The first semiconductor chips 200A1, 200A2, and 200A3 may include a semiconductor substrate 210, a wiring structure 230, a through-electrode 220, a lower connection pad 245, and an upper connection pad 265 disposed on a lower surface thereof. However, in an exemplary embodiment, the second semiconductor chip 200B, which is the uppermost chip, does not include a through-electrode and an upper connection pad.

Referring to FIGS. 15 and 16, each semiconductor substrate 210 may include a device region DA including individual semiconductor devices (or integrated circuits) such as transistors disposed on a lower surface thereof. A wiring structure 230 may be disposed on a lower surface of the semiconductor substrate 210, to connect the device region DA to other connection portions (e.g., through-electrode 220 and lower connection pad 245). The wiring structure 230 may include a dielectric layer 231 and a metal wiring 232 disposed in the dielectric layer 231. As shown in FIG. 16, the wiring structure 230 may include a multilayer structure of a metal wiring layer corresponding to the metal wiring 232. The wiring structure 230 may be connected to the lower connection pad 245 disposed on lower surfaces of the first and second semiconductor chips 200A1, 200A2, 200A3, and 200B.

The through-electrode 220 may extend from the upper surface of the semiconductor substrate 210 toward the lower surface thereof, and may be connected to the device region DA through the wiring structure 230. At least a portion of the through-electrode 220 may have a pillar shape. The through-electrode 220 may include a conductive material 225 and an insulating barrier 221 disposed between the conductive material 225 and the semiconductor substrate 210. For example, the conductive material 225 may include Cu, Co, Mo, Ru, W, or an alloy thereof. For example, the insulating barrier 221 may include $SiO_2$, SiN, SiCN, SiC, SiCOH, SiON, $Al_2O_3$, AN, or a porous material thereof. The through-electrode 220 may be connected to the upper connection pad 265 disposed on the upper surfaces of the first semiconductor chips 200A1, 200A2, and 200A3.

As such, the through-electrode 220 is connected to the wiring structure 230, and electrically connects the lower connection pad 245 and the upper connection pad 265 of the plurality of first semiconductor chips 200A1, 200A2, and 200A3, respectively.

The upper connection pad 265 of the first semiconductor chips 200A1, 200A2 and 200A3 may be directly bonded to the lower connection pad 245 of the other first and second semiconductor chips 200A2, 200A3 and 200B disposed thereon. The upper connection pad 265 and the lower connection pad 245 may include the same metal as each other, for example, copper (Cu). The upper connection pad 265 and the lower connection pad 245, which are in direct contact, may be coupled by mutual diffusion of copper through a high temperature annealing process. A material of the upper connection pad 265 and the lower connection pad 245 is not limited to copper, but rather, may include other materials (e.g., Au) that can be bonded to each other. In an exemplary embodiment, the upper connection pad 265 and the lower connection pad 245 may be connected using a conductive bump such as solder and a non-conductive film NCF.

In an exemplary embodiment, an upper insulating layer 261 of the first semiconductor chips 200A1, 200A2, and 200A3 may be directly bonded to a lower insulating layer 241 of the other first and second semiconductor chips 200A2, 200A3, and 200B disposed thereon. The upper insulating layer 261 and the lower insulating layer 241 may be formed of the same material. For example, the upper insulating layer 261 and the lower insulating layer 241 may include a silicon oxide. The upper insulating layer 261 and the lower insulating layer 241 may be firmly bonded by covalent bonding by performing a high temperature annealing process in a direct contact state. An insulating material of the upper insulating layer 261 and the lower insulating layer 241 is not limited to a silicon oxide, and may use other materials (e.g., SiCN) that may be coupled to each other.

In an exemplary embodiment, an insulating protective layer 250 is disposed between the upper insulating layer 261 and the semiconductor substrate 210. The insulating protective layer 250 may prevent an unwanted electrical connection between the upper connection pad 261 and the semiconductor substrate 210.

The insulating protective layer 250 employed in an exemplary embodiment may include a first region, overlapping the device region DA, in a thickness direction of the semiconductor substrate 210, and a second region (or an edge region) surrounding the first region. The insulating protective layer 250 may have a substantially flat surface in the first region, but may have an edge pattern EP in which all or a part thereof is removed or a predetermined thickness is reduced in the edge region. The edge pattern EP illustrated in an exemplary embodiment is illustrated as an open region having a trench structure similar to the edge pattern EP illustrated in FIGS. 1 and 3, but the edge pattern EP, having another shape among the above-described exemplary embodiments, may also be adopted.

The edge pattern EP may be a portion in which the semiconductor device 100 remains after the scribe lane provided at the wafer level is cut. The edge pattern EP may be positioned in an edge region and may provide stress relaxation for protecting the device region DA and the backside wiring layer during the cutting process.

In addition, the edge pattern EP may be used as an alignment key when manufacturing a stacked package as in the exemplary embodiment described with reference to FIGS. 15 and 16 (see FIG. 9).

The first and second semiconductor chips 200A1, 200A2, 200A3 and 200B obtained by cutting at the wafer level may be stacked such that the device region DA corresponding to the front side faces downward and the backside side faces upward. For example, upper surfaces of the first semiconductor chips 200A1, 200A2, and 200A3 correspond to the second surface (e.g., 101B of FIG. 1) of the semiconductor substrate of the above-described exemplary embodiments, and the insulating protective layer 250 and the upper connection pad 265 of the exemplary embodiment described with reference to FIGS. 15 and 16 correspond to the second insulating protective layer (e.g., 150 of FIG. 1) and the second connection pad 165 in the above-described exemplary embodiments, respectively.

Therefore, in the stacking process of the first and second semiconductor chips 200A2, 200A3, and 200B, an edge pattern EP of the first and second semiconductor chips 200A1, 200A2, and 200A3 positioned therebelow may be used as an alignment key, thereby achieving a more precise stack in the package manufacturing process.

The first semiconductor chips 200A1, 200A2, and 200A3 and the second semiconductor chip 200B may be memory chips or logic chips. In one example, all of the first semiconductor chips 200A1, 200A2, and 200A3 and the second semiconductor chip 200B may be memory chips of the same type, and in another example, a portion of the first semiconductor chips 200A1, 200A2, and 200A3 and the second semiconductor chip 200B may be memory chips, and others may be logic chips.

For example, the memory chip may be a volatile memory chip such as a dynamic random access memory (DRAM) or a static random access memory (SRAM), or a non-volatile memory chip such as a phase-change random access memory (PRAM), a magnetoresistive random access memory (MRAM), a ferroelectric random access memory (FeRAM), or a resistive random access memory (RRAM). In exemplary embodiments, the first and second semiconductor chips 200A1, 200A2, 200A3, and 200B may be high bandwidth memory (HBM) DRAMs. In addition, the logic chip may be, for example, a microprocessor, an analog device, or a digital signal processor.

In an exemplary embodiment, a semiconductor package 300A in which the first semiconductor chips 200A1, 200A2, and 200A3 and the second semiconductor chip 200B are stacked is illustrated, but the number of semiconductor chips stacked in the semiconductor package 300A is not limited thereto.

A connection bump 270 may be disposed on the lower connection pad 245 of the first semiconductor chip 200A1 disposed at the lowermost portion. The connection bump 270 may include, for example, a pillar structure, a ball structure, or a solder layer. The connection bump 270 may be used to electrically connect to an external circuit board.

A molding member 180 may surround side surfaces of the first semiconductor chips 200A1, 200A2, and 200A3 and the second semiconductor chip 200B. In exemplary embodiments, the molding member 180 may cover the upper surface of the second semiconductor chip 200B disposed at the top portion. The molding member 180 may include, for example, an epoxy mold compound (EMC) or the like.

Figure 17:
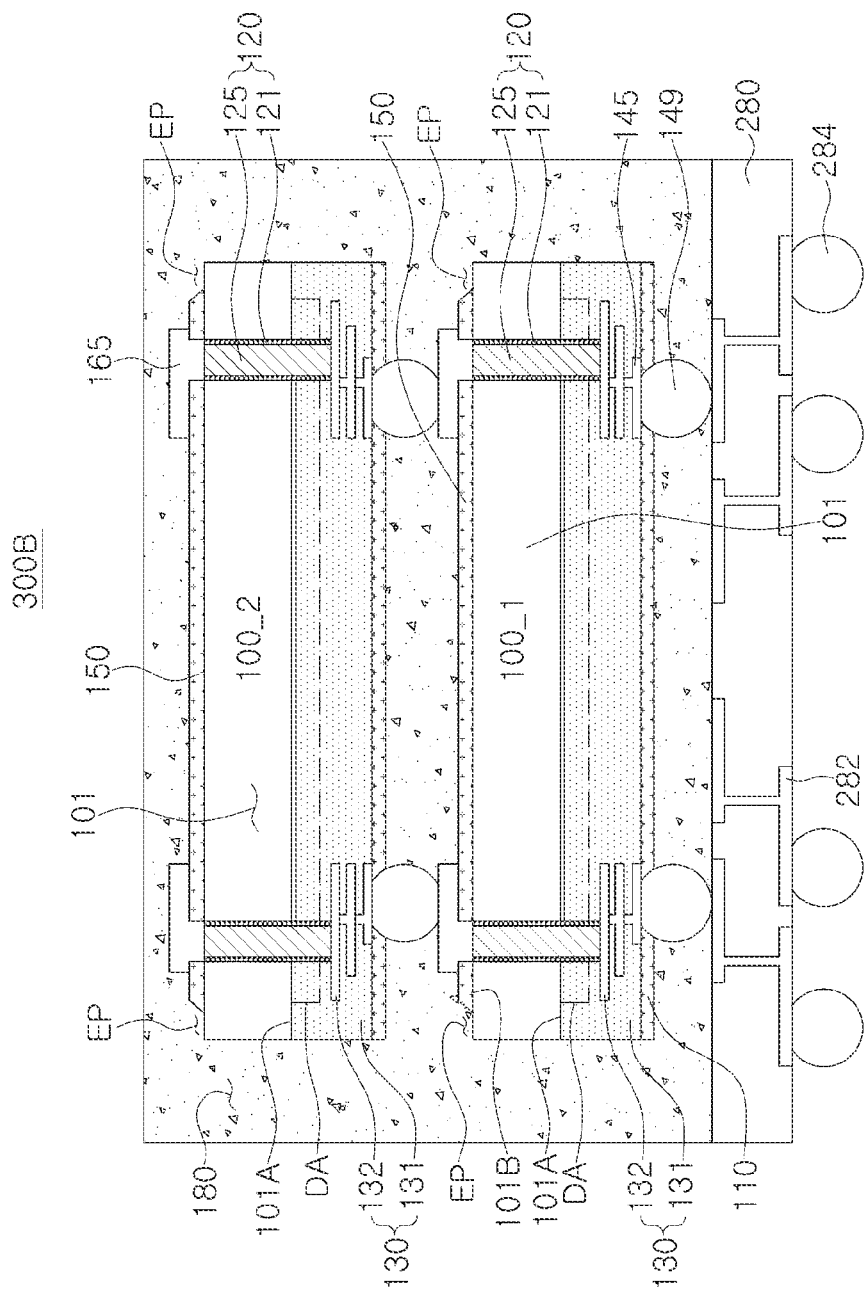
FIG. 17 is a cross-sectional view illustrating a semiconductor package according to an exemplary embodiment of the present inventive concept.

FIG. 17 is a cross-sectional view illustrating a semiconductor package according to an exemplary embodiment of the present inventive concept.

Referring to FIG. 17, a semiconductor package 300B according to an exemplary embodiment may include a package substrate 280 and first and second semiconductor chips 100_1 and 100_2 stacked in a vertical direction on the package substrate 280. The first semiconductor chip 100_1 may also be referred to as a first semiconductor device, the second semiconductor chip 100_2 may also be referred to as a second semiconductor device, and each of the first and second semiconductor devices may correspond to the semiconductor device 100 according to exemplary embodiments described above. The semiconductor package 300B may further include a molding member 180 disposed on the package substrate 280 and encapsulating the first and second semiconductor chips 100_1 and 100_2.

The package substrate 280 may include a circuit pattern 282. For example, the package substrate 280 may be a printed circuit board (PCB) or an interposer. A connection bump 284 connected to the circuit pattern 282 may be disposed on a lower surface of the package substrate 280. The first and second semiconductor chips 100_1 and 100_2 may be semiconductor devices according to the exemplary embodiments described above (e.g., the semiconductor device 100 illustrated in FIG. 1). Each of the first and second semiconductor chips 100_1 and 100_2 may be mounted such that the device region DA corresponding to the front side faces the package substrate 280 and the second surface 101B of the semiconductor substrate 101 faces upward.

The second insulating protective layer 150 employed in an exemplary embodiment may include a first region overlapping the device region DA in a thickness direction of the semiconductor substrate 101 and a second region (or an edge region) surrounding the first region. The edge pattern EP may be a remaining portion of the semiconductor device after the scribe lane provided at the wafer level is cut, and may provide stress relaxation for protecting the device region DA and the backside wiring layer in the cutting process.

In addition, the edge pattern EP may be used as an alignment key when manufacturing a stacked package. In the stacking process of the second semiconductor chip 100_2, an edge pattern EP of the first semiconductor chip 100_1, which is stacked first, may be used as an alignment key, thereby achieving a more precise stack in the package manufacturing process. As set forth above, an insulating protective layer may be processed on a back side of a semiconductor device to provide an identifiable edge pattern. The edge pattern may be used as a stress blocking element that can prevent or reduce damage to an identification element and/or a semiconductor device, such as a scribe lane for a cutting process.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A semiconductor device, comprising:
    a semiconductor substrate having a first surface and a second surface opposing each other;
    a plurality of semiconductor elements disposed on the first surface in a device region, wherein the second surface is divided into a first region overlapping the device region, and a second region surrounding the first region;
    an insulating protective layer disposed on the first region of the second surface of the semiconductor substrate, and having an opening region exposing at least a portion of the second region;
    an upper insulating layer disposed on the insulating protective layer, and having an extended portion extending onto the at least a portion of the second region in the opening region; and
    a connection pad disposed on the insulating protective layer, and electrically connected to the semiconductor elements.

2. The semiconductor device of claim 1, wherein the opening region of the insulating protective layer is disposed along an edge of the second surface.

3. The semiconductor device of claim 1, wherein the opening region surrounds the first region along an edge of the second surface.

4. The semiconductor device of claim 1, wherein the extended portion of the upper insulating layer has a level lower than that of other portion of the upper insulating layer.

5. The semiconductor device of claim 1, wherein the opening region comprises a plurality of opening regions formed in the insulating protective layer.

6. The semiconductor device of claim 5, wherein the plurality of opening regions are arranged in a plurality of rows to surround the first region.

7. The semiconductor device of claim 1, further comprising:
    a through-electrode penetrating the semiconductor substrate and electrically connecting the semiconductor elements and the connection pad.

8. The semiconductor device of claim 7, further comprising:
    a first wiring structure disposed on the first surface of the semiconductor substrate and electrically connected to the device region.

9. The semiconductor device of claim 8, further comprising:
    a second wiring structure disposed between the insulating protective layer and the connection pad, and electrically connecting the through-electrode and the connection pad.

10. The semiconductor device of claim 9, wherein the second wiring structure comprises a metal wiring electrically connecting the through-electrode and the connection pad.

11. A semiconductor device, comprising:
    a semiconductor substrate having a first surface and a second surface opposing each other;
    a plurality of semiconductor elements disposed on the first surface in a device region, wherein the second surface is divided into a first region overlapping the device region, and a second region surrounding the first region;

an insulating protective layer disposed on the first region of the second surface of the semiconductor substrate, and having an edge pattern on at least a portion of the second region, wherein the edge pattern has a thickness smaller than a thickness of a portion of the insulating protective layer positioned in the first region;

an upper insulating layer disposed on the insulating protective layer, and having an extended portion extending onto the edge pattern of the insulating protective layer; and a connection pad disposed on the insulating protective layer, and electrically connected to the semiconductor elements.

12. The semiconductor device of claim 11, wherein the extended portion of the upper insulating layer has a level lower than that of other portion of the upper insulating layer.

13. The semiconductor device of claim 11, wherein the edge pattern is disposed along an edge of the second surface.

14. The semiconductor device of claim 11, wherein the edge pattern surrounds the first region and further comprises a convex portion disposed along an edge of the second surface.

15. The semiconductor device of claim 11, wherein the edge pattern comprises a plurality of concave patterns formed in the insulating protective layer, and each of the plurality of concave patterns is provided as a thinner portion.

16. The semiconductor device of claim 15, wherein the plurality of concave patterns are arranged in a plurality of rows to surround the first region.

17. The semiconductor device of claim 11, further comprising:
a through-electrode penetrating the semiconductor substrate and electrically connecting the semiconductor elements and the connection pad; and
a first wiring structure disposed on the first surface of the semiconductor substrate and electrically connected to the device region.

18. The semiconductor device of claim 17, further comprising:
a second wiring structure disposed between the insulating protective layer and the connection pad, and electrically connecting the through-electrode and the connection pad,
wherein the second wiring structure comprises a metal wiring electrically connecting the through-electrode and the connection pad.

19. The semiconductor device of claim 11, wherein the edge pattern comprises at least a portion of a scribe lane and an alignment key.

20. A semiconductor package, comprising:
a lower semiconductor chip including a lower semiconductor substrate, an insulating protective layer covering an upper surface of the lower semiconductor substrate, a plurality of through-electrodes penetrating through the lower semiconductor substrate and the insulating protective layer, a plurality of upper connection pads arranged on the insulating protective layer and respectively connected to the plurality of through-electrodes, and an upper insulating layer disposed on the insulating protective layer and surrounding the plurality of upper connection pads; and
an upper semiconductor chip stacked on the lower semiconductor chip, the upper semiconductor chip including an upper semiconductor substrate, a wiring structure on a lower surface of the upper semiconductor substrate, a plurality of lower connection pads arranged on the wiring structure and electrically connected to the wiring structure, and a lower insulating layer disposed on the wiring structure and surrounding the plurality of lower connection pads,
wherein the plurality of upper connection pads are directly bonded to the plurality of lower connection pads, respectively, and the upper insulating layer is directly bonded to the lower insulating layer,
wherein the upper surface of the lower semiconductor substrate includes a first region and a second region surrounding the first region, and the insulating protective layer has an open region exposing at least a portion of the second regions,
wherein the upper insulating layer has an extended portion extending onto the second region of the upper surface of the lower semiconductor substrate and separated from the lower insulating layer in a stacking direction.

* * * * *